(12) United States Patent
Gudesen et al.

(10) Patent No.: US 7,266,008 B2
(45) Date of Patent: Sep. 4, 2007

(54) BIMODAL OPERATION OF FERROELECTRIC AND ELECTRET MEMORY CELLS AND DEVICES

(75) Inventors: Hans Gude Gudesen, Brussels (BE); Geirr I Leistad, Sandvika (NO); Isak Engquist, Linköping (SE); Göran Gustafsson, Linköping (SE)

(73) Assignee: Thin Film Electronics ASA, Oslo (NO)

(*) Notice: Subject to any disclaimer, the term of this patent is extended or adjusted under 35 U.S.C. 154(b) by 0 days.

(21) Appl. No.: 11/105,350

(22) Filed: Apr. 14, 2005

(65) Prior Publication Data

US 2006/0002171 A1    Jan. 5, 2006

(30) Foreign Application Priority Data

Apr. 15, 2004   (NO) ................................. 20041540

(51) Int. Cl.
*G11C 7/00* (2006.01)
(52) U.S. Cl. ........................ 365/145; 365/200
(58) Field of Classification Search ................ 365/145, 365/185.24, 200
See application file for complete search history.

(56) References Cited

U.S. PATENT DOCUMENTS

| | | | |
|---|---|---|---|
| 5,262,982 A | | 11/1993 | Brassington et al. |
| 5,519,234 A | * | 5/1996 | Paz de Araujo et al. .... 257/295 |
| 5,539,279 A | | 7/1996 | Takeuchi et al. |
| 5,953,245 A | | 9/1999 | Nishimura |
| 6,141,238 A | | 10/2000 | Forbes et al. |
| 6,809,949 B2 | * | 10/2004 | Ho .............................. 365/145 |
| 2003/0103374 A1 | * | 6/2003 | Sakai et al. .................. 365/145 |
| 2004/0240250 A1 | * | 12/2004 | Karasawa et al. .......... 365/145 |

FOREIGN PATENT DOCUMENTS

| | | |
|---|---|---|
| EP | 0724265 A2 | 7/1996 |
| WO | WO-02/05287 A1 | 1/2002 |
| WO | WO-02/05288 A1 | 1/2002 |

\* cited by examiner

*Primary Examiner*—Michael Tan
(74) *Attorney, Agent, or Firm*—Birch, Stewart, Kolasch & Birch, LLP

(57) ABSTRACT

In a method for enhancing the data storage capability of ferroelectric or electret memory cell which has been applied to storage of data and attained an imprint condition, suitable voltage pulses are used for evoking a temporary relaxation of the imprint condition into a volatile polarization state that can be discriminated from the imprinted polarization state in a non-destructive readout operation. Sequences of one or more voltage pulses are used to evoke readout signals respectively indicative of a non-volatile and a volatile polarization state of the memory cell, but without altering said polarization states. Imprinted memory cells can be overwritten to effect a temporary and volatile storage of data in a memory device in a ferroelectric or electret memory device by assigning a first logical value to imprinted memory cells and a second logical value by transferring selected to memory cells transferred into a relaxed volatile state, whereby the stored logical values can be discriminated by the detecting the difference in dynamic response of respectively imprinted and relaxed memory cells.

10 Claims, 4 Drawing Sheets

Figure 1:
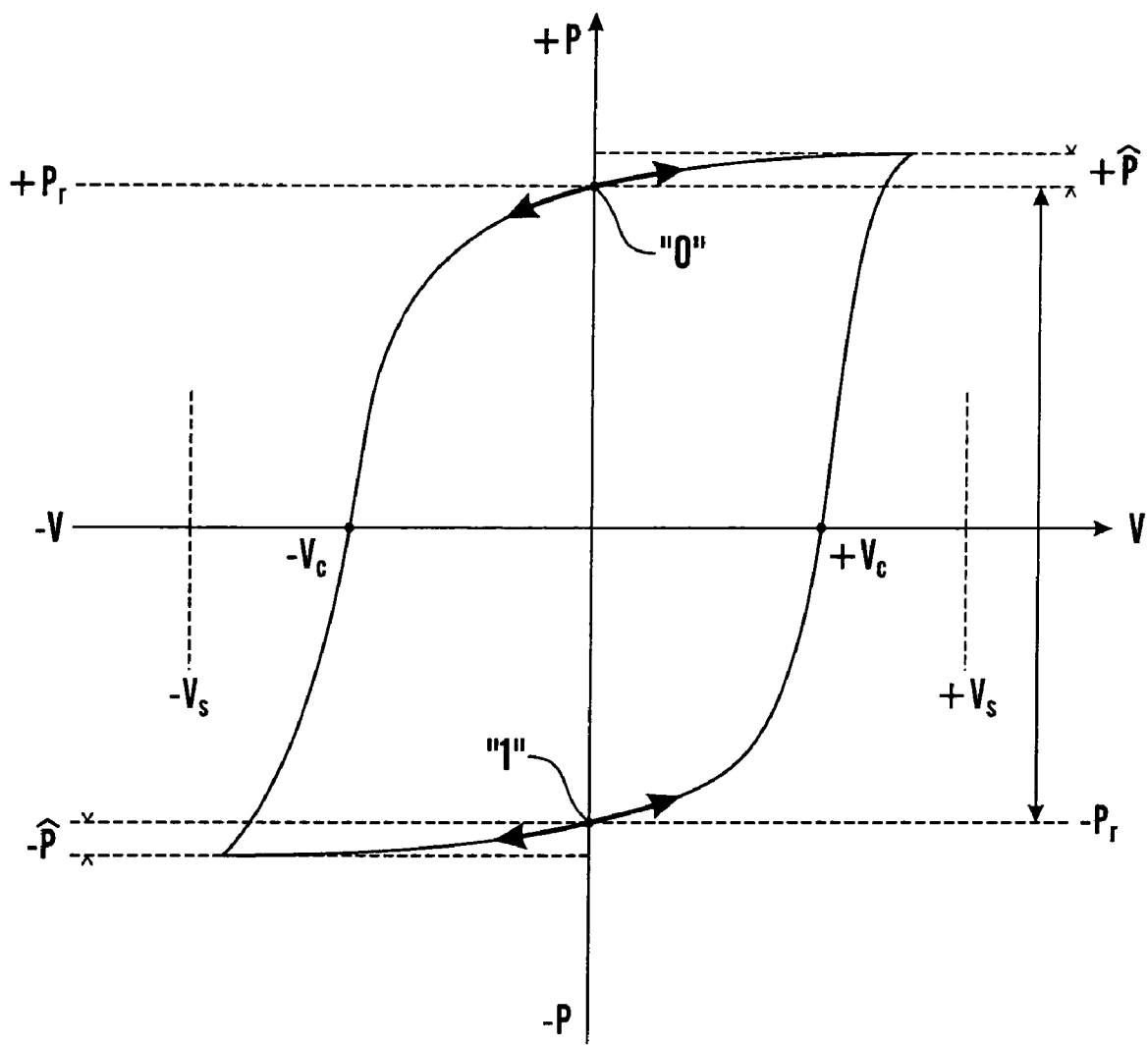

IMPRINTED MEMORY CELL ROW WITH "0" ASSIGNED TO + $P_r$, "1" ASSIGNED TO − $P_r$, AND STORING BYTE 01011001 NON-VOLATILE

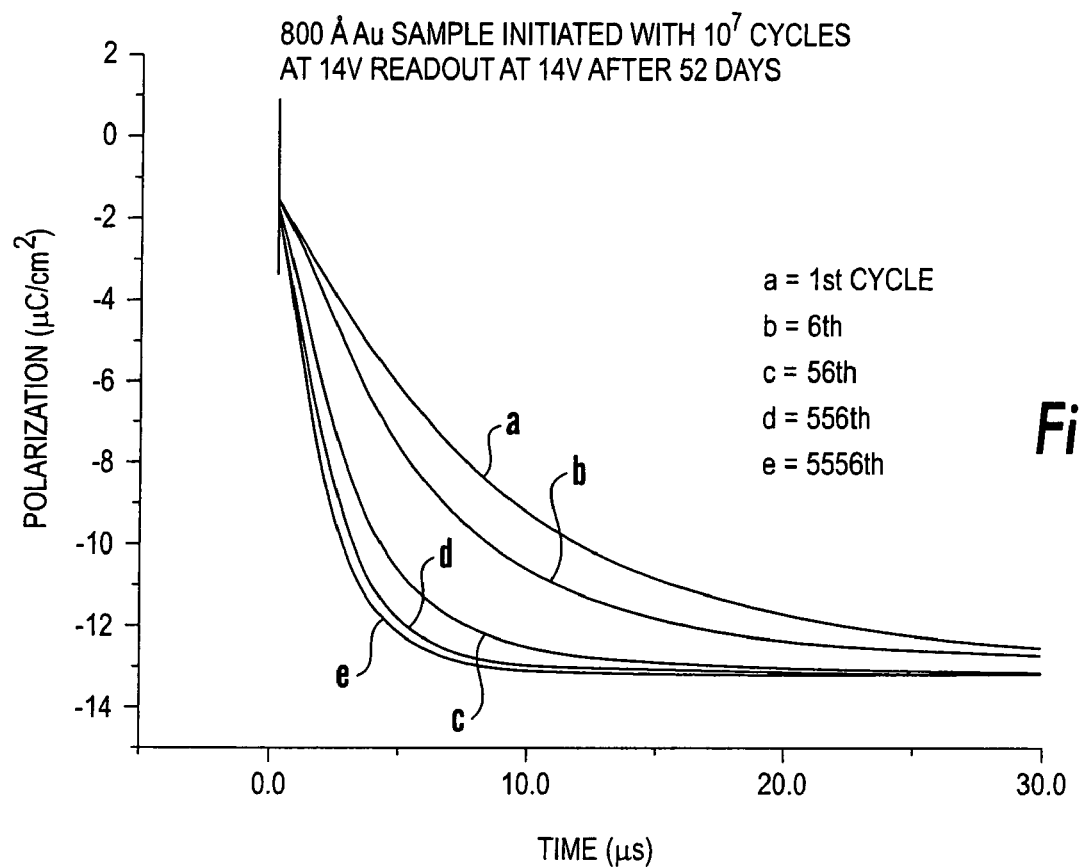
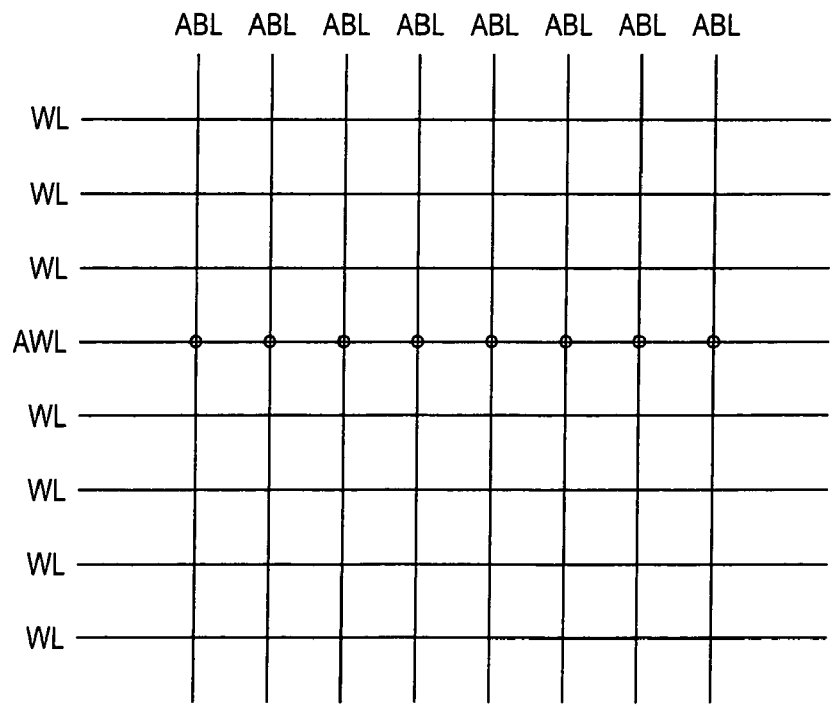

BIMODAL OPERATION OF FERROELECTRIC AND ELECTRET MEMORY CELLS AND DEVICES

The present invention concerns a method for enhancing the data storage capability of a ferroelectric or electret memory cell which has been set in a predetermined remanent and non-volatile polarization state and thereafter allowed to attain an imprint condition. The present invention also concerns methods for non-destructive readout of a ferroelectric or electret memory cell which resides in an imprint condition or wherein its imprint condition has been subjected to a temporary relaxation. Finally the present invention concerns a method for storing and accessing data in a ferroelectric memory device comprising an array of memory cells wherein written data has been written to the memory cells and the memory cells allowed to attain an imprint condition.

In recent years, a range of novel data storage concepts have been proposed based on the use of polarizable dielectric materials as the memory substance and in particular ferroelectric or electret materials that can be polarized to either of two polarization states. In that regard it can be noted that ferroelectric memory materials properly are a subclass of the electret materials having a coercive field and hysteresis. The memory material is typically provided in microscopic memory cell structure which behaves as a capacitor, i.e. it is capable of storing electric charge by subjecting the memory material to an electric field polarizing it into either of opposing directions which can be taken to represent e.g. a logic zero or a logic one respectively. The ferroelectric or electret materials may be inorganic or organic, and the memory cells are preferably provided in a matrix-addressable array, for instance between a first set of parallel stripe-like electrodes called word lines and a second set of parallel stripe-like electrodes called bit lines, and usually provided orthogonally to the first set of electrodes. A matrix of this kind is termed active addressable if switching means, e.g. transistors, are connected with each memory cell or capacitor-like structure, thus preventing the memory material thereof being in permanent contact with at most one electrode outside an addressing cycle, and passive addressable if the memory material of the cells permanently contacts the word line and bit line electrodes, usually by being provided in a global layer therebetween such that electrode sets and the memory material form a sandwich structure, although other arrangements are possible.

Memories based on ferroelectric or electret memory materials are non-volatile, i.e. they retain their charge and hence the stored data in the absence of any applied electric power. They are, however, not without drawbacks, particularly as the reading of the logical value stored in a memory cell typically is destructive. As the logical value of the memory cell is destroyed in the destructive readout operation involving a switching of the polarization state, i.e. a reversal of the direction thereof, this value must hence be written back if it is desired to retain the readout datum. In concrete terms a destructive readout process is distinguished by applying a switching voltage to the memory cell for readout, and in order to generate an easily detectable readout value the switching voltage is usually chosen appreciably larger than the coercive voltage of the memory cell. If the direction of the polarization is aligned with that of the applied electric field, the polarization of the memory cell goes to a saturation value and then back to the original remanent value. However, if the applied field is not aligned with the set polarization of the memory cell, the memory cell switches, i.e. the polarization direction is reversed and the cell ends up in the opposite polarization state.

A particular peculiarity of ferroelectric memory cells is that if they are not subjected to a non-destructive read or another write operation within a fairly short time span, but instead left in their set polarization or logic state for an extended time period, the polarization of the cells so to say becomes "stuck" and very difficult to change under application of an electric field even if it is appreciably larger than the coercive field of the memory material. This alters the dynamic response when a readout or write operation is attempted and phenomenon is usually termed "imprint".

It should be noted that when a memory cell is subjected to an electric field, the polarization change is not instantaneous, but follows a dynamic response curve and this property has formerly been exploited to provide at least a partially non-destructive readout of a matrix-addressable array of ferroelectric or electret memory cells, as disclosed by international published application No. WO02/05288 (assigned to Thin Film Electronics ASA). This is done by limiting a degree of polarization in the polarizable memory material during each read and write cycle to a value defined by a control device and then controlling read and write operations with said value ranging from zero to an upper limit corresponding to or approaching a saturation of the polarization and which is consistent with the predetermined criteria for a reliable detection of the logic state of a memory cell, but without leading to a reversal of the polarization in case the electric field applied for detection is not aligned with the polarization direction already set in the memory cell. However, this method is envisaged for being performed on non-imprinted memory cells, and generally imprint is regarded as a serious drawback for a proper operation of ferroelectric or electret matrix-addressable memory devices. Since this drawback however, is an inherent trait of ferroelectric or electret memory materials, i.e. it shall always occur if the memory cell is left in one and the same polarization state for a sufficiently long time period, without repetitive refresh or repeated addressing operations with sufficiently high frequency. In recognition of this it could be desirable transforming the imprint property into an asset and to actually exploit it in order to enhance the data storage capabilities of ferroelectric or electret matrix-addressable memories.

Hence it is a first object of the invention to provide a method for relaxing temporarily an imprinted polarization state of a memory cell and thereby enhancing its data storage capabilities in a short-term perspective.

It is a further object of the invention to exploit the imprint condition of a memory cell in order to achieve a non-destructive readout.

Finally it is also an object of the present invention to subject an imprinted memory cell to a temporary relaxation of the imprinted polarization state, thus providing the memory cell with an altered dynamic response.

The above objects as well as further features and advantages are achieved with a method which is characterized by applying one or more voltage pulses with a shape and polarity and/or time integral sufficient to evoke a temporary relaxation of the imprint condition and thereby changing an existing imprinted polarization state to a relaxed and volatile polarization state that can be discriminated from the imprinted polarization state in a detection or readout operation performed in a time window given by a time constant of the relaxed and volatile state by either a change in the dynamic polarization response or the memory cell or by a transient change in its charge value or both.

Further features and advantages of this method shall be apparent from the appended claims.

Also the above object as well as further features and advantages are achieved with a first method for non-destructive readout which is characterized by applying one or more voltage pulses with a shape and polarity and/or a time integral sufficient to evoke a readout signal indicative of the non-volatile polarization state of the cell but without altering the non-volatile polarization state of the memory cell, the thus detected readout signal corresponding to a stored logical value or datum which has been set in the memory cell in a write operation according to a predetermined protocol; and a second method for a non-destructive readout which is characterized by applying one or more voltage pulses with a shape and polarity and/or time integral sufficient to evoke a readout signal indicative of a volatile polarization state of the memory cell, but without appreciably altering the volatile polarization state thereof, such that repeated readout operations can be performed in time window wherein the memory cell resides in its transient or volatile polarization state, the thus detected readout signal corresponding to a stored logical value or datum which has been set in the memory in a write operation according to a predetermined protocol, said write operation being performed on an imprinted memory cell by temporarily changing its non-volatile polarization state to a volatile polarization state thereof.

Finally, the above objects as well as further features and advantages are achieved with a method for storing and accessing data which is characterized by overwriting the imprinted cells to effect a temporary and volatile storage of data in the memory device by assigning a first logical value to an imprinted memory cell with no application of a potential difference thereto and assigning a second logical value by applying one or more potential differences across an imprinted memory cell, thus transferring the memory cell to a relaxed polarization state, and discriminating between an imprinted and a relaxed memory cell by recording or detecting a dynamic response thereof, whereby the temporarily stored data can be read out in a non-destructive operation in a time window given by the lifetime of the relaxed polarization state.

Figure 2A:
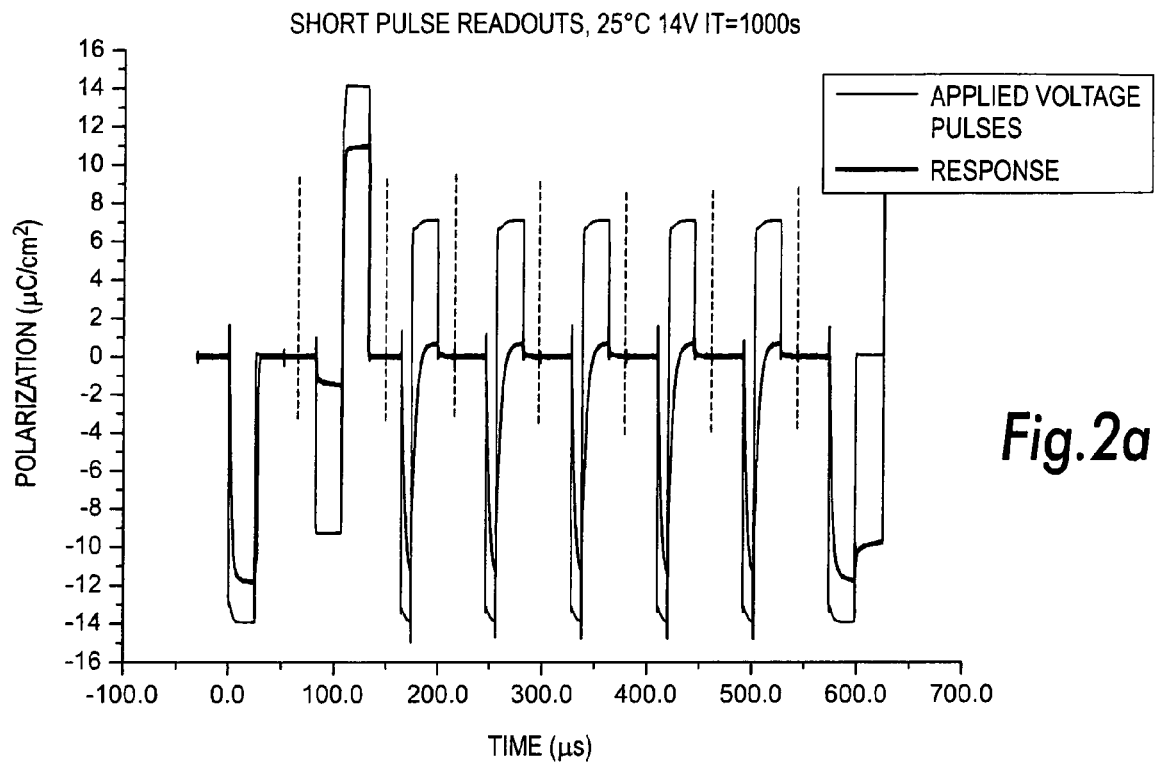

The invention shall be better understood from the following description of various exemplary embodiments thereof taken in conjunction with the appended drawing figures of which FIG. 1 shows a hysteresis curve for a ferroelectric memory material, FIG. 2a a voltage pulse sequence according to the present invention as may be used for relaxing an imprinted polarization state together with the response of a relaxed memory cell.

Figure 2B:
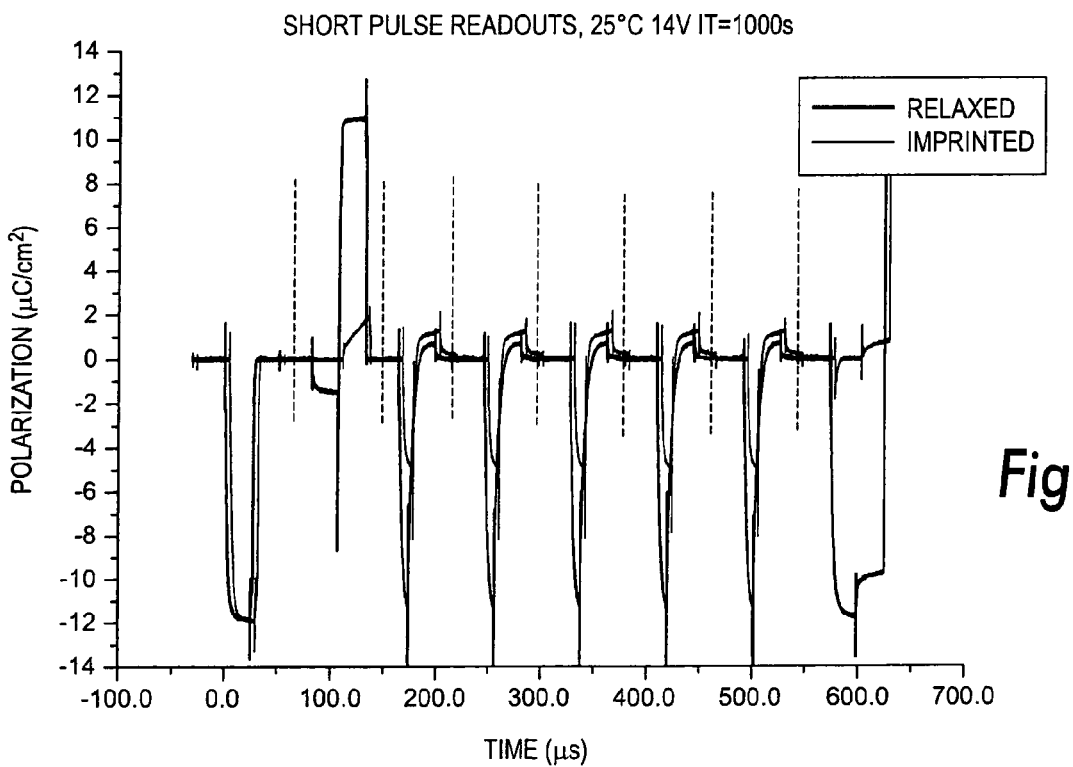

FIG. 2b the dynamic readout response curves for respectively a relaxed and a non-relaxed or imprinted memory cell according to the present invention, FIG. 3 a comparison of the dynamic readout response of an imprinted memory cell with dynamic readout responses evoked by the application of voltage pulse sequences with an increasing number of cycles.

Figure 5A:
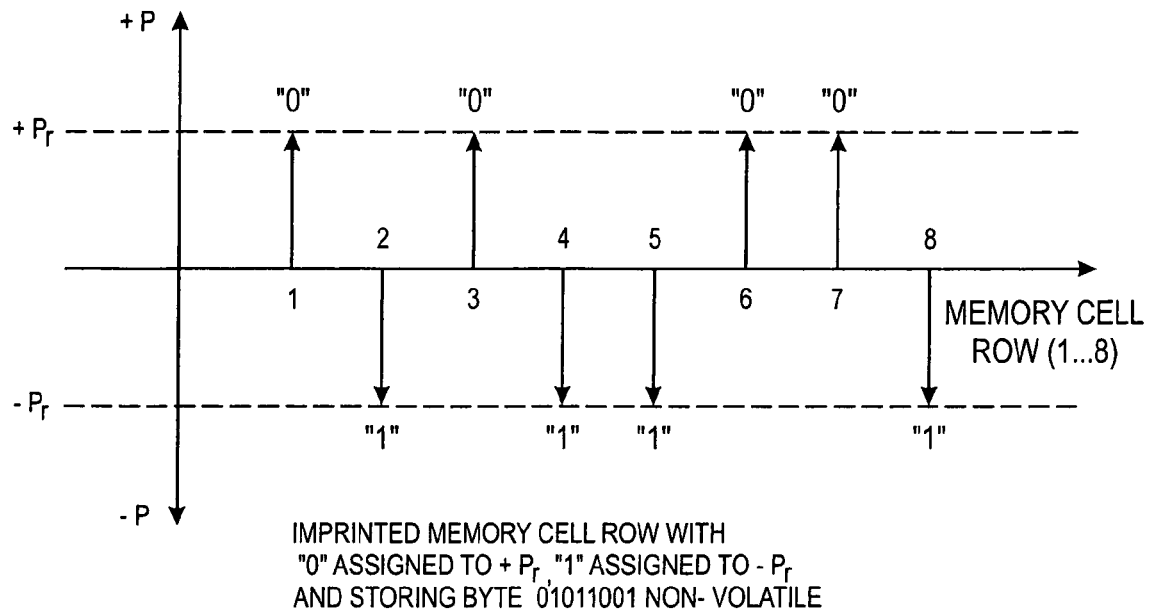
Figure 5B:
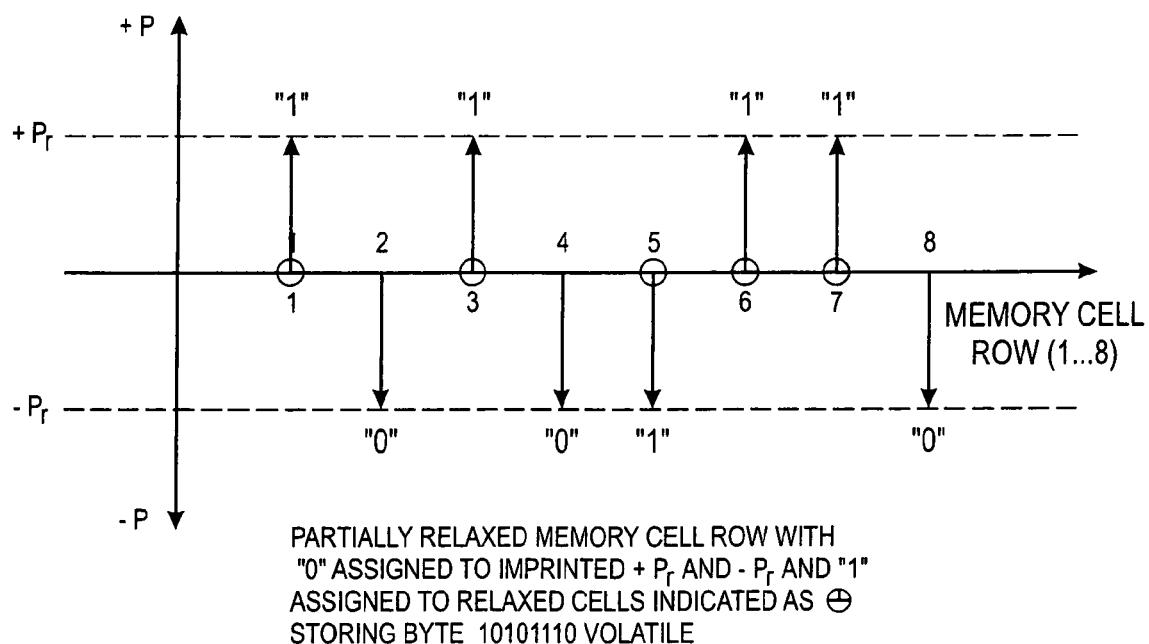

FIG. 4 a schematic representation of a matrix-addressable array of memory cell as employed with the present invention, FIG. 5a a schematic representation of how data in the form of a byte and according to the present invention are written to a row of memory cells and stored in an imprinted condition thereof, FIG. 5b an example how data in the form of a byte are overwritten for temporary or volatile storage on the row of memory cells in FIG. 5a.

The general background of the present invention shall now be explained in some detail with reference to FIG. 1 which shows the hysteresis curve of a ferroelectric material, for instance an organic copolymer such as polyvinylidenefluoride trifluoroethylene (PVDF-TrFE) which is the present prevailing candidate memory material among organic ferroelectric polymers. In the following the memory material will for simplicity's sake be referred to as a ferroelectric memory material, i.e. one capable of being polarized into either of two polarization states and moreover having a coercive field and hysteresis, although it should be understood that the ferroelectric materials form a proper subset of electret materials and are usually distinguished therefrom by its capability of showing hysteresis and a coercive field as stated, that is a material displaying a ferroelectric behaviour below its Curie temperature. Above this temperature it looses its ferroelectric properties and becomes paraelectric. The hysteresis loop in FIG. 1 is shown in a coordinate system where the abscissa gives the voltage and the ordinate the polarization, the latter usually in case of ferroelectric memories measured in $\mu C/cm^2$. Instead of the voltage the abscissa could equally well give the electric field strength, but for the sake of convenience voltage is used as topical to a given memory cell, the voltage parameters easily being calculated from the coercive electric field strength of the material and the thickness of the memory material in the memory cell, i.e. the spacing between the addressing electrodes thereof, that is a word line and a bit line contacting the memory material and together therewith forming a capacitor-like structure. Data is now stored in the memory cell by polarizing the memory material to either of the two remanent polarization states viz. $+P_R$ and $-P_R$ of the memory cell and corresponding to opposite directions of the electric field. The remanent polarization state of the memory material is permanent and can be used for representing a stored logical value or datum, for instance "0" or "1" as indicated in FIG. 1. This value can after being written to the memory cell could be stored indefinitely in a non-volatile condition, in the absence of any further applications of electric fields to memory cell. A typical remanent polarization of a memory cell would be in the order of 10 to 20 $\mu C/cm^2$. The saturation polarization levels are indicated respectively by $+P_S$ and $-P_S$, while the difference between the saturation polarization $P_S$ and the remanent polarization $P_R$ is called the non-switching polarization and denoted $\hat{P}$, i.e. it shall respectively be $+\hat{P}$ and $-\hat{P}$ as is the case. Further the difference of polarization levels between the remanent polarization states is in absolute terms taken as P* and called the switching polarization which amounts to the net polarization change induced when the direction of the polarization is reversed in a switching operation, i.e. applying an electric field strength sufficient to effect this. This coercive electric field shall correspond to the coercive voltages, i.e. the values $+V_C$, $-V_C$ respectively at the crossings of the hysteresis curve and the abscissa. Setting a ferroelectric memory cell from its virgin or unpolarized state to a desired polarization state is done by applying a potential difference or voltage difference across the memory material and larger than the coercive voltage $V_C$, usually as for instance at least 50% larger than $V_C$. This voltage level is called the switching voltage $V_S$. In case $V_S$ is aligned with polarization direction, for instance positive and in FIG. 1 referred to as $+V_S$, the polarization will be driven to the saturation value $+P_S$ and then relax to the remanent polarization state $+P_R$ which in FIG. 1 is taken to represent the storage of a logic 0. Similarly applying a negative switching voltage $-V_S$ shall result in the memory cell being polarized to the opposite remanent polarization $-P_R$ in FIG. 1, and taken to represent the storage of a logic 1. Readout of the stored logical value can now immediately take place by interrogating the memory cell with an appropriate voltage pulse, usually the switching voltage $V_S$. In the case the memory cell is in a positive remanent polarization state $+P_R$ and storing a logical 0, a positive switching voltage $+V_S$ will drive the polarization of the memory cell towards the saturation $+P_S$ and it will then after removing switching voltage $+V_S$ relax back to the remanent polarization state $+P_R$. The induced polarization change corresponds in this case to the non-switching polarization $\hat{P}$ and usually results in the output of a current signal on the bit line electrode with a strength corresponding to the induced polarization change. If the memory cells are in their negative remanent polarization state $-P_R$, thus storing a logic 1, a large positive switching voltage $+V_S$ shall drive the polarization of the memory cell to the positive saturation value $+P_S$, whereafter the removal of the switching voltage $+V_S$ results in the memory cell relaxing to the opposite remanent polarization $+P_R$. In other words the direction of the polarization or the electric field is now reversed and the initial datum stored, namely "1" has now been converted to a "0". The assigned logical value is of course dependent on the predetermined or chosen protocol, i.e. convention. Then the net change in the polarization corresponds to the switching polarization P* and results in a readout signal on the bit line correspondingly large such that the difference between the stored logic "0" and "1" easily is discriminated in the readout operation. However, if the original datum were destroyed in a so-called destructive readout process, it can only be retained by now performing a write operation to the memory cell in order to once more change the polarization direction thereof. This is done by applying a negative switching voltage $-V_S$ to the cell which is in the positive remanent polarization $+P_R$ and shall result in driving the polarization of the cell towards to the negative saturation polarization $-P_S$, whereupon the memory cell after removal of the switching voltage $-V_S$ relaxes back to the original negative remanent polarization $-P_R$, thus restoring the originally written logic "1".

In the above discussion it is assumed that a memory cell is in a non-imprinted condition, i.e. the data stored permanently, but readout and switching is easily performed by applying e.g. a single switching voltage pulse in the readout operation and a destroyed datum is similarly quite easily reset by applying the switching voltage $V_S$, but with the opposite sign, to the memory cell. However, if the memory cell is left unaddressed for some time after the initial setting or writing of a datum thereto, it tends to imprint, i.e. to end up more or less permanently locked in its remanent polarization state and shall not respond to e.g. normal application of a switching voltage thereto. The imprinted condition can be relaxed and the data content of the memory cell read or reset, however, by applying one or more voltage pulses with either a very large amplitude, or as is the case sufficiently long duration to evoke a response or ultimately to perform a destructive readout or reset of the memory cell. In other words, in the imprinted condition the possibility of carrying out an addressing operation to a memory cell depends on applying voltage pulses of an appropriate shape and/or with sufficient time integrals to relax the imprint condition of the memory cell. Such an imprint-relaxing operation is also termed refresh as after it has been performed it shall render the memory cell once more accessible in the normal mode and dependent on the subsequent access frequency it may then remain in the non-imprint condition. In other words, by applying repetitive refresh voltage cycles with a suitably high frequency, imprint can be avoided.

The polarization state of an imprinted memory cell may be changed in different ways, but according to a preferred embodiment of the present invention imprint is relaxed by applying a rapid sequence of bipolar voltage pulses of fairly short duration or length, but with voltages comparable to the switching voltage or even higher. This procedure shall relax the imprint condition and the data content of the cell can be read out as normal. A preferred voltage pulse sequence for effecting a relaxation of this kind in an imprinted memory cell is shown in FIG. 2a. This figure renders the voltage pulse sequence applied for relaxing and the resulting readout response of a memory cell at 25° C. after residing in the imprint condition for 1000 s. The applied voltage pulse sequence is shown with a thin line and comprises an initial pulse of about 30 μs duration followed by a sequence of much shorter pulses of opposite polarity. The readout response as shown in a thick line in FIG. 2a shows up as ringing pulse sequence, initially for instance as a 30 μs pulse corresponding to a polarization of between 10 and 12 μC/cm² followed by a sequence of very sharp pulses of the opposite polarity, but with approximately the same polarization value as the first pulse. It should be noted that the pulse amplitudes indicate the correspondingly attained polarization values, while the short lines perpendicular to the abscissa mark breaks of the time axis. FIG. 2b shows pulse sequences for the response of respectively a relaxed, i.e. non-imprinted memory cell and an imprinted memory cell. The thin line renders readout pulse sequence for the relaxed cell at 25° C. and after 1000 s imprint time, while the thick line renders the readout response for a memory cell still in the imprint condition. As will be seen, there is an appreciably difference in the charge values both in the case of the amplitudes of the first pulse in each sequence as well as the amplitudes of the following negative pulses of the sequences. This implies that it shall be easy to discriminate between a readout signal from a memory cell in its relaxed condition and a memory cell in its imprint condition. Similar to FIG. 2a, the lines perpendicular to the abscissa in FIG. 2b mark breaks of the time axis. The initial triggering pulse of the sequence has a voltage of 14 V, which could be regarded as the normal switching voltage, but of course, without effecting anything than temporary or transient changes in the polarization as no permanent change in its direction occurs and the readout operation in that sense is non-destructive, i.e. the original polarization state is retained, but the readout or when it once more is allowed to settle in its imprint condition.

The actual and instantaneous polarization values of the memory cell shall, however, oscillate about the remanent polarization values with periods dependent on the pulse sequence time parameters and a time constant of the dynamic polarization response.

The readout signal in the relaxed mode, however, shall differ appreciably from the one which can be obtained from the imprinted memory cell and this shows up in the dynamic characteristics thereof as shown in FIG. 3. Herein the uppermost curve denotes the dynamic polarization response for a non-relaxed and imprinted memory cell using a reading pulse of 5 μs. The following curves in succession denote the application of the indicated number (6 to 5556) of bipolar 30

μs voltage pulses initially at 14 V after the memory cell has been in the imprint condition for 52 days. It is easily seen that for instance using a pulse sequence of 56 bipolar 30 μs voltage pulses resulting in the third response curve from the top and bottom causes an appreciable difference in the signal strength between the imprinted, i.e. the non-relaxed memory cell and the relaxed memory cell. In the first case the polarization after 5 μs is about −6 μC/cm$^2$; in the second about −11 μC/cm$^2$, giving a signal strength difference of about 5 μC/cm$^2$. This surprisingly large difference in signal strength can be exploited to enhance the data storage capability of the memory cells in a wholly novel and unexpected manner as will be discussed in detail further below.

FIG. 4 shows very schematically the layout of a memory device as an array of memory cells and as would be used with the present invention. For the sake of simplicity the memory device in FIG. 4 is shown as a passive matrix with only 8 word lines and 8 bit lines and thus 64 memory cells in all. Generally the number of word lines and bit lines each shall run into thousands and the memory matrix comprise millions of memory cells at the crossings thereof. Assuming that the data have been written to all memory cells in the memory device of FIG. 4 and left in that state for a time which may amount from a fraction of a second to an indefinite time period, the memory cells will be stuck in an imprint condition, i.e. much larger energy shall be needed in order to evoke a response from the memory cells, e.g. for readout or for switching the memory cells to opposite polarization state. It shall now be assumed that a full row of a matrix-addressable memory device shown in FIG. 4 shall be overwritten in its imprint condition with the new data. FIG. 5 shows a diagram representing the row of memory cells corresponding to the situation where active word line AWL has been written with the data word or byte 01011001. The polarization states are indicated for the row of 8 memory cells in succession on the horizontal axis, while on the vertical axis at left the polarization levels are given. Each memory cell is represented by an arrow indicating that the polarization corresponds to remanent polarizations of memory material and hence the data byte 01011001 is set in the row of memory cells with either of the polarization states and imprinted in these as indicated. It is now desired to temporarily overwrite this imprinted byte with a new data word or byte 10101110. This is then done by relaxing the imprinted polarization state of the first memory cell, leaving the imprinted polarization stated of the second cell, relaxing the polarization state of the third cell, leaving the imprinted polarization of the fourth cell, relaxing the polarization state of the fifth cell, and relaxing the polarization states of the sixth and seventh cell, while the eighth and final cell is left in its imprinted condition. The memory cells remaining in their imprinted states irrespective of whether these are corresponding to the positive or negative remanent polarization state are now taken to represent a logic 0, while all the relaxed memory cells are taken to represent a logic 1. This allows for a very simple rewrite protocol, as the original polarization states do not matter at all. The protocol only requires that a first logic state (in this case a logic 0) is assigned to the imprinted memory cells while a second logic state (in this case a logic 1) is assigned to the relaxed memory cells. Readout is now easily performed by an initial bipolar pulsing with a fairly high voltage, say rather more than ten volts in which case the still imprinted condition will be revealed by a very slow or missing dynamic response, while the relaxed memory cells have a much larger dynamic response as evident from FIG. 2b. Of course, if no further access is attempted within the time window given by the lifetime of the relaxed polarization state, these memory cells will resettle to the initially imprinted condition and the information written is lost.

As will be seen, readout of relaxed memory cells according to the present invention takes place non-destructively and without return to the imprinted polarization state simply by monitoring the dynamic response in the readout cycle. This has already been proposed in the above-mentioned published international patent application WO02/05288 and will moreover be the standard mode for readout also with the present invention, i.e. it is the dynamic response that actually matters in the readout process and the differences in the recorded dynamic response that allows for discrimination between the stored logical values. It will be seen that although the relaxation of an imprinted memory cell corresponding to a write operation thereto is slow with regard to the random access time, the possibility of parallel write shall serve to increase the bit rate appreciably. The data stored with the use of relaxed memory cells eventually will be lost, but there are as mentioned a number of cases where a temporary storage of data is required or desirable, even for just a few seconds or a fraction of a second. A typical instance is the temporary storage of intermediate data generated in a data processing operation and which shall be uploaded in an immediately succeeding step of the processing operation. So-called high-speed cache or buffer memories may be used for this, but they shall in addition also be allocated for the permanent storage of other types of data, for instance source code, e.g. as used in the processing operation and which must be retained. This, of course, diminishes the storage space available for prior art temporary storage of data which can be a drawback in larger data processing operations where the need for both permanent and temporary data storage in the internal memory requires a large data storage capacity.

As shall be obvious to persons skilled in the art, operating a ferroelectric memory device according to the invention with memory cells in the imprint (non-volatile and relaxed (volatile) condition involves non-destructive addressing operations, i.e. no switching of the polarization directions of the memory cells take place. This can be compared with addressing operations in a non-imprinted memory device, when on the average 50% of the memory cells in a row (assuming an equal distribution of logic zeros and logic ones) shall be switched in a readout operation. As readout nearly always shall be performed as a full row read, i.e. all memory cells on the active word lines are read in parallel and a data word equal to the number of memory cells (or bit lines) of the row output, the readout generate a so-called disturb, that is undesired voltage pulses to the non-addressed memory cells on the inactive word lines. This can to a large extent be ameliorated by applying a suitable voltage pulse protocol prescribing the application of voltage levels that for instance amount to a selected fraction, usually one-half or one-third of the switching voltage to the word lines and bit lines outside a read cycle and clamping inactive word lines during the read cycle for instance to the same voltage level as the active bit lines, thereby eliminating potential differences between the formed and latter, which shall server to alleviate the effect of disturb voltages. Similar protocols are also applied when destructively read memory cells must be reset, i.e. switched back to their original polarization state, i.e. logic value. This entails a somewhat more complex protocol, involving reset (or refresh) on the average only as performed on one-half of the memory cells of a row, i.e. on a word line (concerning voltage pulse protocols for addressing operations in ferroelectric memories, see international published application WO02/05287. In the present invention all non-addressed cells of course are in the imprint condition and any write/read operations, which usually can be performed as a full row write/read, are always non-destructive and shall not be able to generate any mentionable disturb, to which imprinted memory cells in any case largely will be immune.

The present invention discloses a method that shall allow a memory to be wholly devoted to permanent storage of data while at the same time it shall allow the permanently stored data to be overwritten for temporary storage.

This, of course, effectively doubles the data storage capacity of ferroelectric or electret memories as used with the present invention The volatile or the relaxed states may then after the data has been e.g. up- or down-loaded in a further transfer operation simply revert back to the original imprinted states wherein the permanently stored data of course can be accessed as mentioned above.

However, it may be desirable to retain the data that was stored in the second mode that is with the use of volatile storage in relaxed memory cells. This can be done by subjecting the relaxed memory cells of the repetitive refresh with frequency of say 10-1000 Hz such that they remain in their volatile state. Alternatively the readout data may be transferred to another location in the same memory device and written thereto as alternating polarization states, which optionally can be left to imprint, in which case a refresh shall be required before a conventional destructive readout is attempted. It should, however, be obvious to persons skilled in the art that suitable mapping procedures can be applied to the memory devices for optimally handling the storage of data therein as desired or required. Moreover it should also be noted that repetitive refresh operations for retaining data stored in a relaxed or volatile condition is akin to refresh operations as required to retain stored data in dynamic random access memories (DRAMs), and hence a ferroelectric memory operated in the relaxed mode in this aspect resembles a DRAM.

For all practical purposes it can be seen that the imprinted ferroelectric or electret memory device can be regarded as a kind of ROM when left in its imprinted state. Data can be accessed and read out, but no attempt is made to refresh or relax the memory cells and relax the imprinted memory state. The implication of storage in the imprint condition is that the memory is only written once and then read out as many times as desired and possibly with long intervals between the readouts. On the other hand the data storage capacity of course can be doubled if the same memory is employed in the manner disclosed in the present invention, namely by using the volatile or relaxed polarization states for a temporary storage of data overwritten the permanently stored data in the imprint condition of the memory.

To sum up, the present invention allows for an operation of ferroelectric or electret memory devices wherein the memory device in the first mode is simply operated as a ROM and with the advantage of non-destructive readout and in the second mode is operated as a fast transient buffer by employing relaxed states of the imprinted memory cells, but wherein data still can be accessed for non-destructive readout. As persons skilled in the art easily will realize, a number of variant protocols may be employed with the present invention. Finally, the interesting but trivial observation can be made that since the data storage by overwrite of the imprinted memory cells of course is volatile and transient, one can observe how the volatile data fades away before one's eyes and actually vanished without a trace, reverting to the initial imprinted state. This peculiar phenomenon may open for the application of the present invention in other contexts than those related to data storage only.

The invention claimed is:

1. A method for enhancing the data-storage capability of a ferroelectric or electret memory cell, which has been set in a predetermined remanent or non-volatile polarization state and thereafter allowed to attain an imprint condition, comprising:
    applying one or more voltage pulses with a shape and polarity and/or time integral sufficient to evoke a temporary relaxation of the imprint condition and thereby changing an existing imprinted polarization state to a relaxed and volatile polarization state that can be discriminated from the imprinted polarization state in a detection or readout operation performed in a time window given by a time constant of the relaxed and volatile state by a change in the dynamic polarization response of the memory cell or by a transient change in its charge value or both.

2. The method according to claim 1, wherein
    more than one voltage pulse is applied, and
    the applied voltage pulses are bipolar.

3. The method according to claim 1, wherein
    application of said voltage pulse or pulses corresponds to write operation on the memory cell whereby a stored non-volatile logic state or datum is overwritten with the same or another logic state or datum for temporary or volatile storage.

4. The method according to claim 1, wherein
    said write operation is performed dependent of an existing non-volatile logic state of the imprinted memory cell, and subject to a predetermined protocol.

5. The method according to claim 1, wherein
    said write operation is performed independent of an existing non-volatile logic state of the imprinted memory cell, and subject to a predetermined protocol.

6. The method according to claim 1, wherein
    said write operation is performed by subjecting the memory cell to said voltage pulses with the same polarity.

7. The method according to claim 1, wherein said write operation is performed by subjecting the memory cell to said voltage pulses with both polarities.

8. The method according to claim 1, wherein
    the memory cell is subjected to said one or more voltage pulse/pulses having a shape and polarity and/or time integral that causes the imprinted memory cell to change dynamic response of the memory cell, said changed dynamic response being assigned a logical value or stored datum according to the predetermined protocol.

9. A method for non-destructive readout of a ferroelectric or electret memory cell which has been set in a predetermined or non-volatile polarization state and allowed to attain an imprint condition, whereafter the imprinted condition has temporarily been changed to a transient volatile polarization state, comprising:
    applying one or more voltage pulses with a shape and polarity and/or time integral sufficient to evoke a readout signal indicative of a volatile polarization state of the memory cell, but without appreciably altering the volatile polarization state thereof, such that repeated readout operations can be performed in time window wherein the memory cell resides in its transient or volatile polarization state, the thus detected readout signal corresponding to a stored logical value or datum which has been set in the memory in a write operation according to a predetermined protocol, said write operation being performed on an imprinted memory cell by temporarily changing its non-volatile polarization state to a volatile polarization state thereof.

10. A method for storing and accessing data in a ferroelectric memory device comprising an array of memory cells wherein data has been written to the memory cells and the memory cells allowed to attain an imprint condition, comprising:

overwriting the imprinted cells to effect a temporary and volatile storage of data in the memory device by assigning a first logical value to an imprinted memory cell with no application of a potential difference thereto and assigning a second logical value by applying one or more potential differences across an imprinted memory cell, thus transferring the memory cell to a relaxed polarization state, and discriminating between an imprinted and a relaxed memory cell by recording or detecting a dynamic response thereof, whereby the temporarily stored data can be read out in a non-destructive operation in a time window given by the lifetime of the relaxed polarization state.

* * * * *